United States Patent
Frank et al.

(10) Patent No.: US 9,935,032 B2
(45) Date of Patent: Apr. 3, 2018

(54) POWER ELECTRONICS ARRANGEMENT AND VEHICLE WITH SAID ARRANGEMENT

(71) Applicant: SEMIKRON ELEKTRONIK GMBH & CO. KG, Nürnberg (DE)

(72) Inventors: Thomas Frank, Lauf (DE); Christian Walter, Ansbach (DE); Stefan Weiss, Hoechstadt (DE); Thomas Ziegler, Piech (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 0 days.

(21) Appl. No.: 15/487,519

(22) Filed: Apr. 14, 2017

(65) Prior Publication Data

US 2017/0301600 A1    Oct. 19, 2017

(30) Foreign Application Priority Data

Apr. 18, 2016    (DE) .......................... 10 2016 107 083

(51) Int. Cl.
*B60K 1/04* (2006.01)
*H01L 23/32* (2006.01)
(Continued)

(52) U.S. Cl.
CPC ............... *H01L 23/32* (2013.01); *B60K 1/02* (2013.01); *B60K 1/04* (2013.01); *B60K 7/0007* (2013.01);
(Continued)

(58) Field of Classification Search
CPC .. F28F 9/007; F28F 9/075; B60K 1/02; B60K 1/025
See application file for complete search history.

(56) References Cited

U.S. PATENT DOCUMENTS 5,947,188 A * 9/1999 Nestvall ............. H05K 7/20872
123/41.31
2002/0189874 A1 * 12/2002 Sato .................... B60R 16/0239
180/65.8

FOREIGN PATENT DOCUMENTS

DE    10 2008 012 570    9/2009
DE    10 2008 034 467    2/2010
(Continued)

OTHER PUBLICATIONS

DE 10 2016 107 083.1, German Examination Report dated Oct. 18, 2016, 6 pages—German, 3 pages—English.

*Primary Examiner* — John D Walters
*Assistant Examiner* — James J Triggs
(74) *Attorney, Agent, or Firm* — Andrew F. Young, Esq.; Lackenbach Siegel, LLP (57) ABSTRACT

A power electronics arrangement has a power semiconductor module, with a contact spring, with a load connecting element and with a mounting device which is embodied as part of an electrically operated vehicle. The power semiconductor module has a load connection element which preferably projects outwards from the interior of the power semiconductor module, and preferably has there a first external contact face for external connection, and the load-connecting element has a second contact face. An electrically conductive pressure contact connection is embodied between the first contact face and the second contact face by a contact spring, wherein the pressure on the contact spring which is necessary for this is implemented by connecting the power semiconductor module in a frictionally locking fashion to the mounting device.

15 Claims, 5 Drawing Sheets

(51) Int. Cl.
  *H01R 13/73*   (2006.01)
  *H01R 12/82*   (2011.01)
  *H01L 23/367*  (2006.01)
  *H01R 12/70*   (2011.01)
  *B60K 7/00*    (2006.01)
  *B60K 1/02*    (2006.01)
  *B66F 9/075*   (2006.01)
  *H05K 7/14*    (2006.01)

(52) U.S. Cl.
  CPC ...... *B66F 9/07572* (2013.01); *H01L 23/3672* (2013.01); *H01R 12/7047* (2013.01); *H01R 12/82* (2013.01); *H01R 13/73* (2013.01); *H05K 7/1432* (2013.01); *B60K 2007/0061* (2013.01); *H01L 2224/18* (2013.01); *H01L 2224/4846* (2013.01); *H01L 2224/48472* (2013.01); *H01R 2201/26* (2013.01)

(56) References Cited

FOREIGN PATENT DOCUMENTS

DE   10 2012 219 791   5/2013
JP   S 59 18 434       2/1984

\* cited by examiner

POWER ELECTRONICS ARRANGEMENT AND VEHICLE WITH SAID ARRANGEMENT

CROSS REFERENCE TO RELATED APPLICATIONS

This application relates to, and claims priority from, German Ser. No. DE 10 2016 107 083.1 filed Apr. 18, 2017, the entire contents of which are incorporated herein by reference.

BACKGROUND OF THE INVENTION

Field of the Invention

The invention describes a power electronics arrangement with a power semiconductor module and with a mounting device, and an electric vehicle with said arrangement.

Description of the Related Art

A mounting device for the electric power component in a battery operated industrial truck is known from the prior art, disclosed for example in DE 10 2010 053 135 A1, the entire contents of which are incorporated by reference, said mounting unit having a mounting plate which can be attached to a securing component of the industrial truck, a semiconductor plate which bears the power electronics, and a housing lid which covers the semiconductor plate, wherein the semiconductor plate is attached directly to the mounting plate.

ASPECTS AND SUMMARY OF THE INVENTION

According to one aspect of the present invention, there is provided a power electronics arrangement has a power semiconductor module, with a contact spring, with a load connecting element and with a mounting device which is embodied as part of an electrically operated vehicle. The power semiconductor module has a load connection element which preferably projects outwards from the interior of the power semiconductor module, and preferably has there a first external contact face for external connection, and the load-connecting element has a second contact face. An electrically conductive pressure contact connection is embodied between the first contact face and the second contact face by a contact spring, wherein the pressure on the contact spring which is necessary for this is implemented by connecting the power semiconductor module in a frictionally locking fashion to the mounting device.

Against the background of the specified prior art, the invention is based on the object of presenting a power semiconductor module within the scope of a power electronics arrangement and a vehicle, wherein the integration of the power semiconductor module into the vehicle is configured in a particularly effective fashion.

This object is achieved according to the invention by means of a power electronics arrangement having the features of the claims and by means of a vehicle having the features of the description herein.

The power electronics arrangement according to the invention is embodied with a power semiconductor module, with a contact spring, with a load connecting element and with a mounting device which is preferably embodied as part of an electrically operated vehicle, wherein the power semiconductor module has a load-connection element which preferably projects outwards from the interior of the power semiconductor module, and preferably has there a first external contact face, that is to say a contact face for external connection, and wherein the load connecting element has a second contact face. An electrically conductive pressure contact connection, that is to say a frictionally locking contact, is embodied between the first contact face and the second contact face by means of the contact spring, wherein the pressure on the contact spring which is necessary for this is implemented by virtue of the fact that the power semiconductor module is connected in a frictionally locking fashion to the mounting device, preferably by means of a screw connection.

On the one hand, it can be advantageous if the electrically conductive pressure contact connection is embodied as a direct connection between the first contact face and the second contact face.

On the other hand, it can be advantageous if the electrically conductive pressure contact connection is embodied as an indirect connection between the first contact face and the second contact face, preferably in that the contact spring is arranged between the first and second contact faces and is embodied in an electrically conductive fashion, wherein a third contact face of the contact spring is respectively in direct electrical contact with the first contact face, and the fourth contact face of the contact spring is respectively in direct electrical contact with the second contact face.

It is particularly preferred if the mounting device has a pin which is preferably composed of an electrically insulating material. In this context, the pin can extend into the interior of the contact spring which is embodied as a helical spring. Likewise, the pin can extend through a cutout in the load connecting element. Furthermore, the pin can extend into the interior of the load connection element which is embodied at least partially as a contact sleeve.

On the one hand, it can be advantageous if the load connection element projects outwards through a plastic housing of the power semiconductor module. On the other hand, the load connection element can project outwards through a metallic baseplate, which preferably embodies a part of a cooling device, of the power semiconductor module, wherein it is also preferred if the load connection element is electrically insulated with respect to the baseplate.

The electrically driven vehicle according to the invention is embodied, inter alia, with a power electronics arrangement according to one of the preceding claims, with an energy storage device and with an electric drive motor as a main drive or auxiliary drive.

It is particularly advantageous if the mounting device is an integral component of a drive axle.

It is also advantageous if the energy storage device and the drive motor are connected in an electrically conductive fashion to the power semiconductor module of the power electronics arrangement by means of a multiplicity of load connecting elements and assigned load connection elements.

It is self-evident that, in so far as this is not ruled out per se, the features which are specified in the singular, in particular the load connection elements and load connecting elements, as well as the contact springs and pins, can be present several times in the respective arrangement or the vehicle.

Of course, the various refinements of the invention can be implemented individually or in any desired combinations in order to achieve improvements. In particular, the features which are specified and explained above and below can, irrespective of whether they are specified within the scope of the arrangement or of the vehicle, be used not only in the specified combinations but also in other combinations or alone, without departing from the scope of the present invention.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Figure 1:
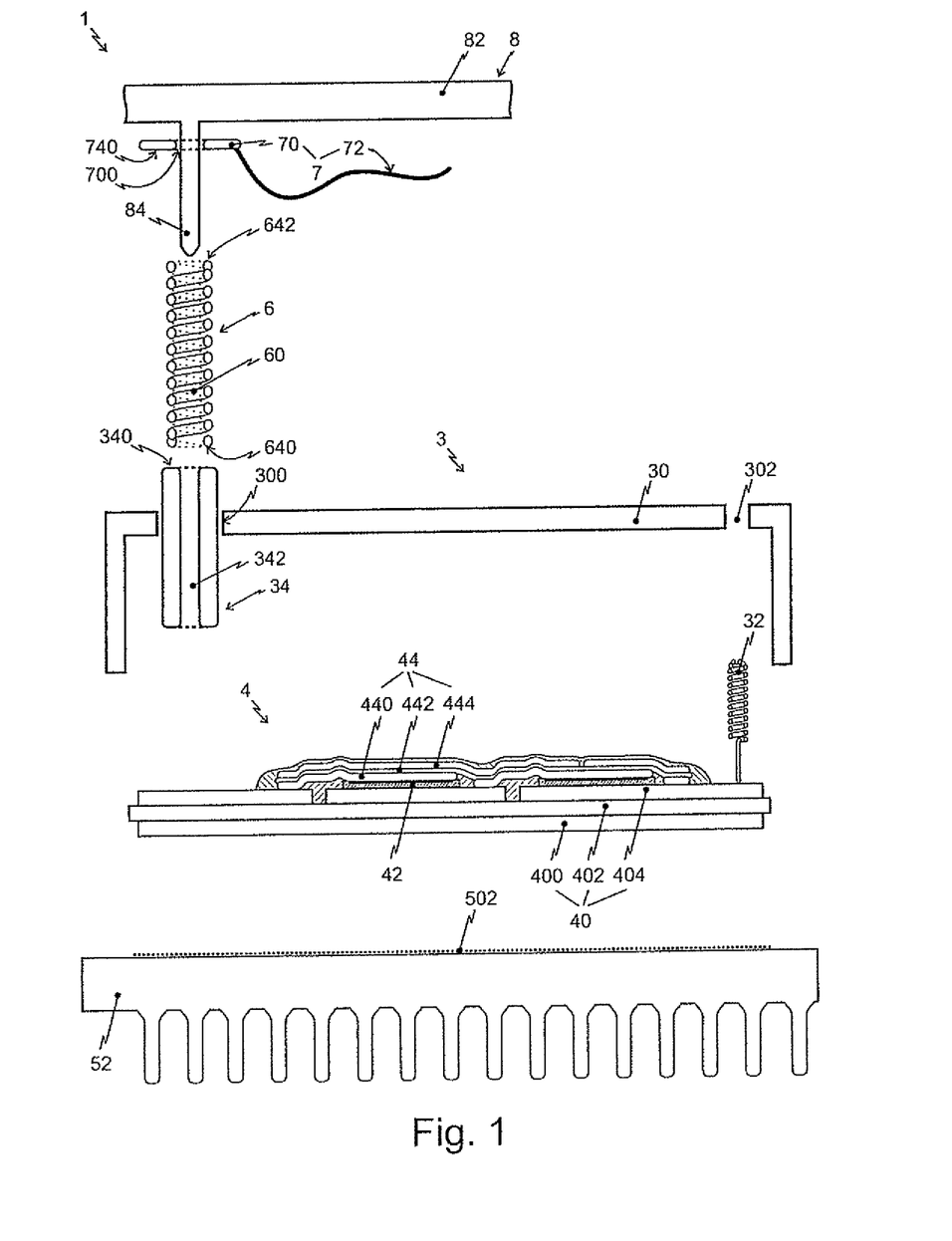
FIG. 1 is a schematic view of a first refinement of a power electronics arrangement according to the invention.

FIG. 1 is a schematic view, in an exploded illustration, of a first refinement of a power electronics arrangement 1 according to the invention. Said arrangement 1 has a power semiconductor module 3 which, for its part, is composed of a housing 30, a circuit carrier 4 and a metallic baseplate, embodied here as an air cooling device 52. The circuit carrier 4 is arranged here on the air cooling device 52 by means of a heat conducting layer 502 and is covered with respect to the air cooling device 52 or surrounded by the housing 30 which is in the form of a pot here.

The circuit carrier 4 has in this refinement a conventional substrate 40 with a ceramic insulating body 402 which has a multiplicity of conductor tracks 404 on the side facing away from the air cooling device 52, and a metallic lamination 400 on the side facing the air cooling device 52. The conductor tracks 404 bear semiconductor components 42 which are connected appropriately for the circuitry by means of an internal connecting device 44, which is likewise embodied here conventionally by means of electrically conductive films 440, 444 and electrically insulating films 442.

The housing 30 has two cutouts 300, 302 on its side facing away from the air cooling device 52. The first cutout 300 serves to lead through a load connection element 34, which therefore projects outwards from the interior of the power semiconductor module 3, while the second cutout 302 serves to lead through an auxiliary connection element 32, which is embodied here as a spring.

The load connection element 34 is embodied here as a current conducting sleeve, more precisely as a hollow cylinder, and is in contact with a conductor track 404 of the substrate 40 in the interior of the power semiconductor module 3.

Furthermore, a mounting device 8, such as can be for example part of an industrial truck, is illustrated only as a detail. This mounting device 8 has an insulating material body 82 which, for its part, has a pin 84 which is embodied integrally with the insulating material body. This pin 84 serves for the arrangement of a contact body 70, embodied as a contact eyelet, of a load connecting element 7. This contact eyelet has a continuous cutout 700 with which it is arranged on the pin 84 of the insulating material body 82 of the mounting device 8. A connecting line 72 leads away from the contact eyelet and serves, for example, for connection to a battery, more generally an energy storage device, or to an electric drive motor, more generally an electric machine. This refinement of the load connecting element 7 is purely exemplary, basically here all conventional variants are possible, for example even in the form of current conducting rails.

A contact spring 6 which is embodied as a helical spring is also illustrated. The pin 84 extends into the interior 60 of this contact spring 6 and guides the latter in its arrangement with respect to the load connecting element 7, more precisely to its contact eyelet and also to the load connection element 34 of the power semiconductor module 3. The electrically conductive connection between the load connection element 34 and the load-connecting element 7 is established by screwing the power semiconductor module 3 onto the mounting device 8, that is to say connecting it thereto in a frictionally locking fashion, cf. also FIG. 5. In this context, pressure is applied to the contact spring 6 and the latter is tensioned. This results, on the one hand, in an electrically conductive contact between a first contact face 340 of the load connection element 34 and a third contact face 640 of the contact spring 6, on the other hand between a fourth contact face 642 of the contact spring 6 and a second contact face 740 of the load connecting element 7, to be more precise here its contact eyelet 70. Of course, the contact spring 6 is made of conductive material, preferably metal. There is therefore an indirect electrically conductive pressure contact connection of the first and second contact faces 340, 740.

Figure 2:
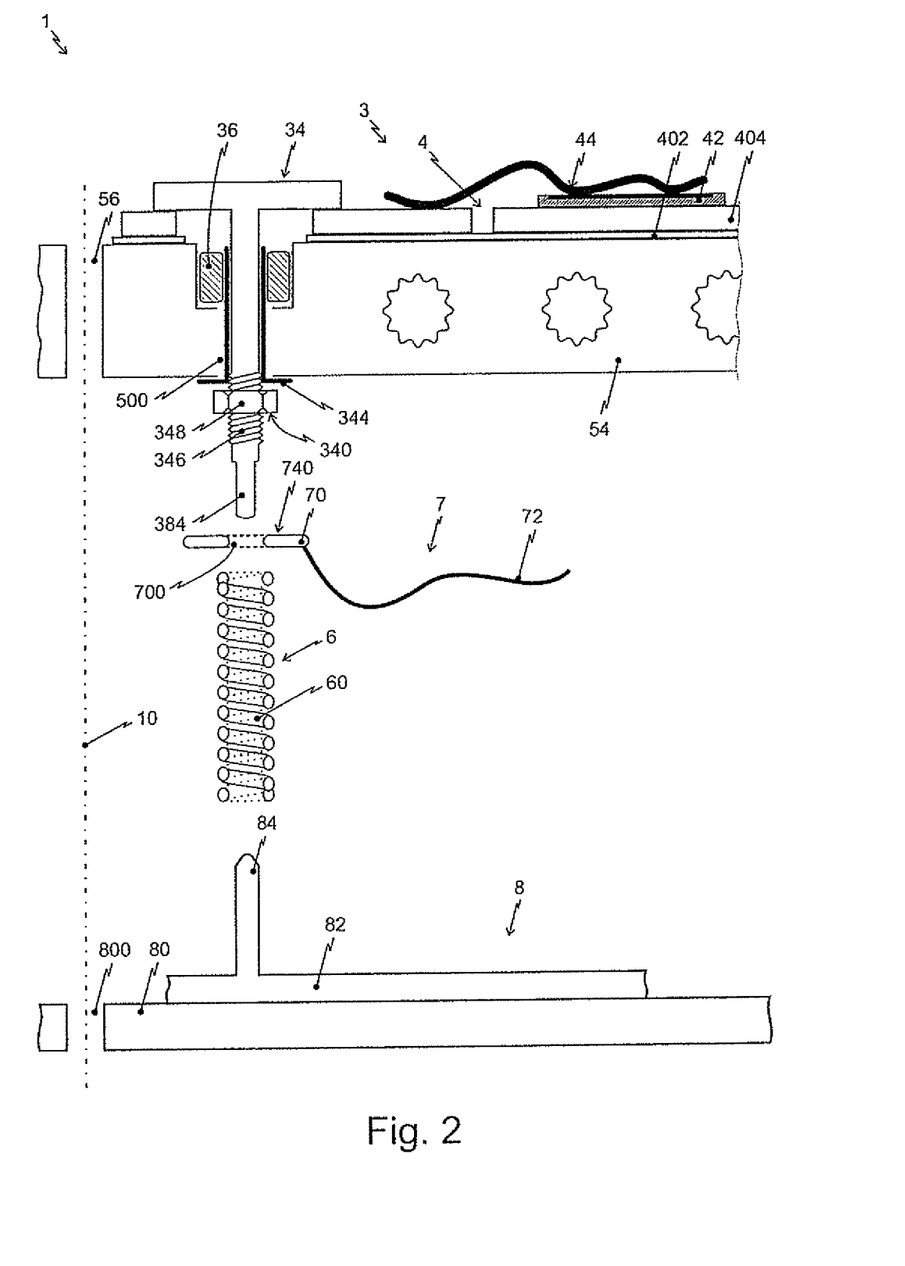
FIG. 2 is a schematic view of a second refinement of a power electronics arrangement according to the invention.

FIG. 2 is a schematic view, in an exploded illustration, of a second refinement of a power electronics arrangement 1 according to the invention. Said arrangement 1 has a power semiconductor module 3 which, for its part, has a circuit carrier 4 and a metallic baseplate, embodied here as a liquid cooling device 54.

The circuit carrier 4 has in this refinement a conventional insulating substrate which has, on the side facing away from the liquid cooling device, a multiplicity of conductor tracks 404 which are arranged electrically insulated with respect to the liquid cooling device by means of an insulating material body 402. The conductor tracks 404 bear power semiconductor components 42 which are connected appropriately for the circuitry by means of an internal connecting device 44, which are embodied conventionally here by means of wire bonded connections.

The liquid cooling device 54 has a cutout 500 through which a load connection element 34 extends. In this cutout 56, a current sensor 36 is additionally arranged. The load connection element 34 is electrically insulated with respect to the liquid cooling device 54 by means of an insulating device 344. In addition, the load connection element 34 has a screw connection 346 and a screw nut 348 with which it is fixedly arranged with respect to the cooling device 54. The screw nut 348 forms here the first contact face 340, that of the load connection element 34. In the extension of the screw thread 346, the load-connection element 34 also has a pin like section 384.

A mounting device 8 is also illustrated, again only as a detail. Said mounting device 8 has an insulating material body 82 which, for its part, has a pin 84 which is embodied integrally with the insulating material body. This pin 84 is aligned with the pin-like section 384 of the load connection element 34 without touching it in the mounted state, wherein this is not to be understood in the restrictive fashion. This pin like section 384 serves for the arrangement of a contact body 70, embodied as a contact eyelet, of a load-connecting element 7. This contact eyelet has for this purpose a continuous cutout 700. As already described above with respect to FIG. 1, a connecting line 72 extends away from the contact eyelet 70. This refinement of the load connecting element 7 is also purely exemplary here, basically all conventional variants are possible.

The contact spring 6 is arranged on the pin 84 of the mounting device 8 in such a way that the pin 84 extends partially into the interior 60 of the contact spring 6 which is embodied as a helical spring. The pin like section 384 of the load connection element 34 projects not only through the cutout 700 of the contact eyelet 70 of the load connecting element 7 but also into the interior 60 of the contact spring 6. As a result, the contact spring 6 and the load connecting element 7 are already aligned with respect to one another during the mounting of the arrangement.

In contrast to the first refinement according to FIG. 1, the contact spring 6 is itself not involved in the conduction of current here, since the second contact face 740, that of the load connecting element 7, is in direct electrically conductive contact with the first contact face 340, that of the load connection element 34, as a result of which a direct electrically conductive pressure contact connection is formed.

This direct electrically conductive pressure contact connection is established between the load connection element 34 and the load connecting element 7 in that the power semiconductor module 3 is screwed onto the mounting device 8, as is indicated by the dashed line 10. In this context, pressure is applied to the contact spring 6 and the latter is tensioned. Therefore, the contact spring 6 presses on the contact eyelet 70 of the load connecting element 7, as a result of which its first contact face 340 is pressed onto the second contact face 740 of the load connecting element 7.

Figure 3:
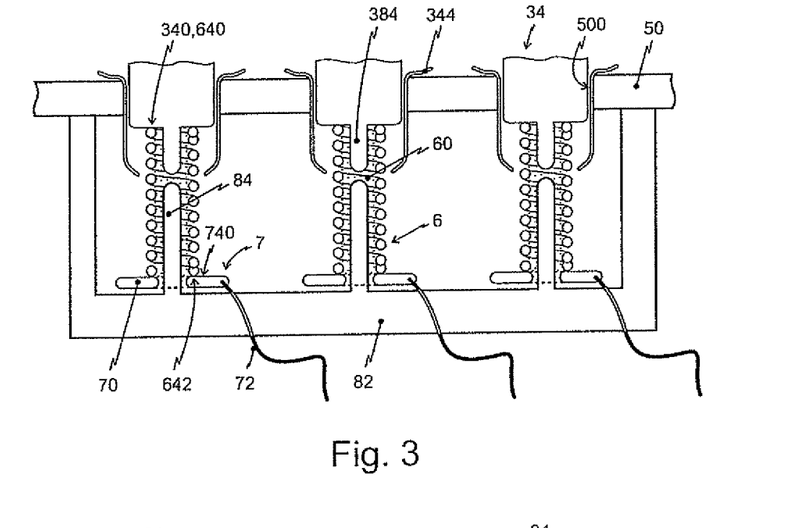
FIGS. 3 to 5 are schematic views of different variants of a third refinement of a power electronics arrangement according to the invention.
Figure 4:
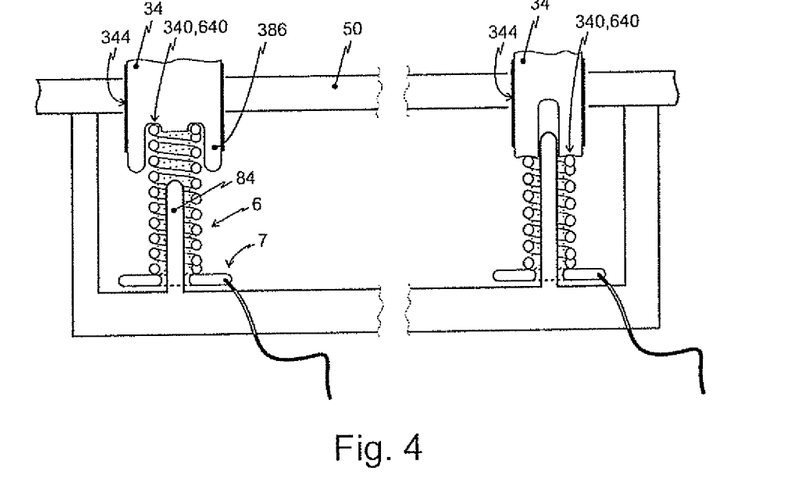
Figure 5:
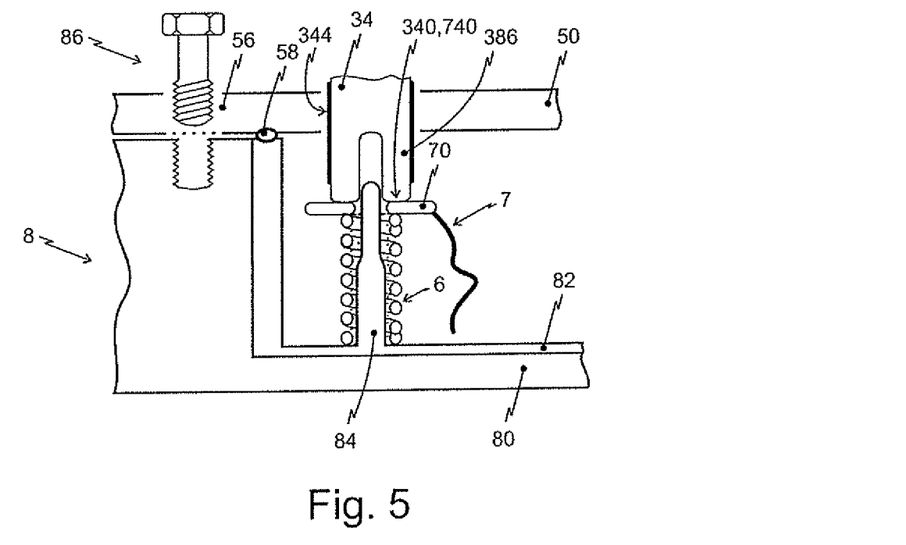

FIGS. 3 to 5 are different schematic views of a third refinement of a power electronics arrangement according to the invention. The variants according to FIGS. 3 and 4 have in common the fact that here a metallic baseplate 50 of a power semiconductor module is illustrated, wherein a multiplicity of load connection elements 34 extend through cutouts 500 in this baseplate 50, and are electrically insulated thereby by means of an insulation device 344. It is also a common feature that an insulating material body 82 of a mounting device 8 has a multiplicity of pins 84, wherein each pin 84 is assigned a load connecting element 7. The contact device 70 of each load connecting element 7 has a cutout 700 through which the assigned pin 84 extends. Furthermore, a contact spring 6 is arranged on each pin 84, wherein the pin 84 extends into the interior 60 of the contact spring 6 which is embodied as a helical spring.

In the variant according to FIG. 3, the load connection elements 34 are embodied in a cylindrical shape, each with a centrally aligned pin-like section 384. This pin-like section 384 is arranged aligned with the respectively assigned pin 84 of the mounting device 8, wherein the pin 84 and the pin like section 384 extend from opposite sides into the interior 60 of the contact spring 6 which is embodied as a helical spring, and therefore secure the latter in its position.

The electrically conductive pressure contact connection between the first contact face 340, that of the load connection element 34, and the second contact face 740, that of the load connecting element 7, is embodied here in each case as an indirect connection between the first contact face 340 and the second contact face 740 in that the contact spring 6 is arranged between the first and second contact faces and is embodied in an electrically conductive fashion, and wherein a third contact face 640 of the contact spring 6 is respectively in direct electrical contact with the first contact face 340, and the fourth contact face 642 of the contact spring 6 is respectively in direct electrical contact with the second contact face 740. Of course, contact faces which are in direct electrical contact with one another always face one another, as is also generally the case.

In the variant according to FIG. 4, in contrast to the variant according to FIG. 3, the load connection elements 34 are embodied in a shape, each cylindrical with a centrally aligned sleeve like section 386. In a refinement of this sleeve like section 386, a section of the contact spring 6 projects completely into this sleeve like section. In another refinement the pin 84 projects into the sleeve like section 386, while the contact spring 6 is in direct electrical contact with the cover face, which can have a circumferential depression and which forms the first contact face 340.

The variant according to FIG. 5 shows a detail from a mounting device 8 illustrated in the way in which it can be, in particular, part of an industrial truck. This mounting device 8 has the already known insulating material body 82 with a pin 84 which is embodied integrally therewith, and a metallic base body 80.

The metallic baseplate 50 of a power semiconductor module 3 has a multiplicity of cutouts 500, just one of which is illustrated, which extend through the load connection elements 34 which are each electrically insulated with respect to the baseplate 50 by means of an insulation device 344. The respective load-connection element 34 has in turn a hollow cylindrical section 386 into which the pin 84 of the mounting device 8 extends. The contact spring and the load connecting element are in turn arranged on this pin 84 by means of the cutout thereof in the contact body 70. The contact spring 6 is embodied here from an electrically insulating material or has at least one electrically insulating surface.

In preparation of the mounting of the power semiconductor module 3 with respect to the mounting device 8, the non tensioned contact spring 6, like the respective load connecting element 34, is arranged on the assigned pin 84. The pin 84 extends here through a cutout 700 in the contact body 70 of the load connecting element 7, as it also does through the interior 60 of the contact spring 6 which is embodied as a helical spring.

The frictionally locking connection of the power semiconductor module 3, to be more precise its baseplate 50, to the mounting device 8 is made by means of a screw connection 86. For this purpose, without restricting the generality, the mounting device 8 has an internal thread and the baseplate has, aligned therewith, a cutout 56 for the arrangement of a screw. By fitting the power semiconductor module 3 onto the mounting device 8 and screwing the two together, the spring 6 is tensioned and by means of the pressure which is applied to the load connecting element 7, the electrically conductive pressure contact connection is embodied as a direct connection between the first contact face 340, that of the load connection element 34, and the second contact face 740, that of the load connecting element 7 which is assigned to the load connection element 34.

In addition, a sealing device 58 which is easy to implement but is very effective is illustrated here. Said sealing device 58 is embodied as a round section seal which runs around all the cutouts 500 in the baseplate 50 to permit load connection elements 34 to be led through, and which therefore seals the baseplate 50 with respect to the mounting device 8, here without restricting the generality with respect to its insulating material body 82. Conventionally, there would, in particular, be individual seals here between the load connection elements and the baseplate.

Figure 6:
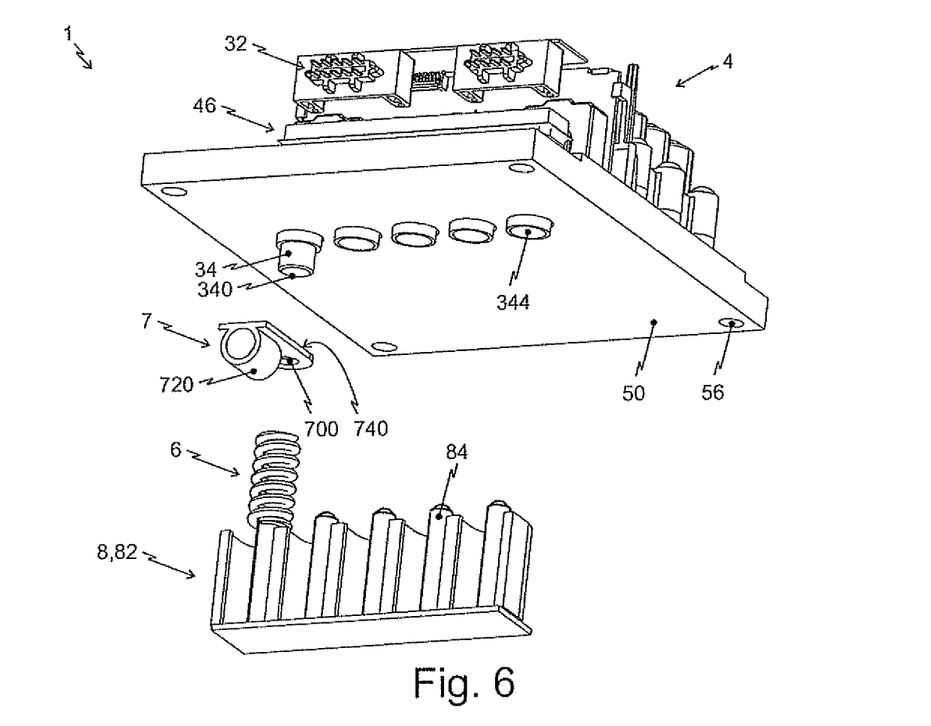
FIG. 6 shows a further variant of the third refinement of a power electronics arrangement according to the invention in a three dimensional view.

FIG. 6 shows a further variant of the third refinement of a power electronics arrangement 1 according to the invention in a three dimensional exploded view. A power semiconductor module 3 with a metallic baseplate 50 is illustrated. Conventional components are arranged on said baseplate 50. Furthermore, plug type connectors 32 for auxiliary connections and a yoke 46 for supporting pressure forces which are directed from the inside into the power semiconductor module 3, which are generated by the contact spring 6 and which act on the load connection elements 34 are illustrated.

The load connection elements 34, of which of only one is illustrated, project into insulating material sleeves 344 through the baseplate 50. The load connection elements 34 are embodied in turn as hollow cylinders with a first contact face 340 on the lid surface of the hollow cylinder.

The refinement of the mounting device 8, load connecting device 7 and of the contact spring 6, as well as their arrangement, is basically as described with respect to FIG. 5.

Figure 7:
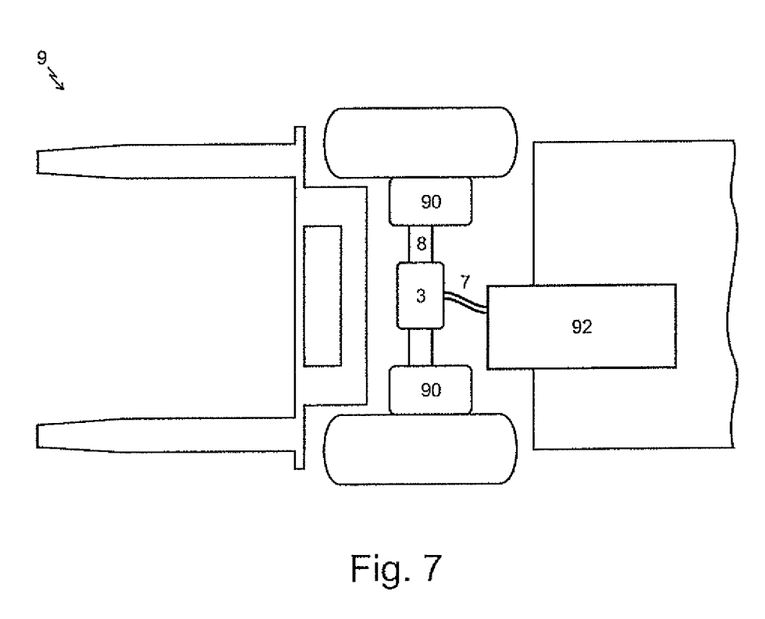
FIG. 7 is a schematic view of an electric vehicle according to the invention.

FIG. 7 is a schematic view of an electrically driven vehicle 9 according to the invention, here specifically an industrial truck, such as for example a fork lift truck, in a partial view. In particular the front axle of the fork lift truck with one drive motor 90 for each wheel is illustrated. The front axle, generally the wheel carrier or wheel suspension system, functions in this refinement as the mounting device 8 which is described above in detail and on which the power semiconductor module 3 is directly arranged. This power semiconductor module 3 is connected by means of load connecting elements 7 to the drive motors 90 and to an energy storage device 92, that is to say to a battery, to be more precise to an accumulator which can be recharged.

Various operations may be described as multiple discrete operations in turn, in a manner that may be helpful in understanding embodiments of the present invention; however, the order of description should not be construed to imply that these operations are order dependent.

Although only a few embodiments have been disclosed in detail above, other embodiments are possible and the inventors intend these to be encompassed within this specification. The specification describes certain technological solutions to solve the technical problems that are described expressly and inherently in this application. This disclosure describes embodiments, and the claims are intended to cover any modification or alternative or generalization of these embodiments which might be predictable to a person having ordinary skill in the art.

Also, the inventors intend that only those claims which use the words "means for" are intended to be interpreted under 35 USC 112, sixth paragraph. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power electronics arrangement (1), with a power semiconductor module (3), with a contact spring (6), with a load-connecting element (7) and with a mounting device (8), wherein:
    the power semiconductor module (3) has a load-connection element (34) and a first external contact face (340);
    the load connecting element (7) has a second contact face (740);
    a contact spring (6) enables an electrically conductive pressure contact connection between the first contact face (340) and the second contact face (740); and
    wherein said power semiconductor module (3) is further frictionally connected to the mounting device (8) and provides a pressure force on the contact spring (6).

2. The power electronics arrangement according to claim 1, wherein:
    the electrically conductive pressure contact connection is a direct connection between the first contact face (340) and the second contact face (740).

3. The power electronics arrangement according to claim 1, wherein:
    the electrically conductive pressure contact connection is an indirect connection between the first contact face (340) and the second contact face (740);
    the contact spring (6) arranged between the first and second contact faces is electrically conductive;
    further comprising:
        a third contact face (640) of the contact spring (6) is in respectively direct electrical contact with the first contact face (340); and
        a fourth contact face (642) of the contact spring (6) is in respectively direct electrical contact with the second contact face (740).

4. The power electronics arrangement, according to claim 1, wherein:
    the contact spring (6) is a helical spring.

5. The power electronics arrangement, according to claim 4, wherein:
    the mounting device (8) has a pin (84) which is composed of an electrically insulating material.

6. The power electronics arrangement according to claim 5, wherein:
    the pin (84) extends into an interior (60) of the contact spring (6).

7. The power electronics arrangement, according to claim 4, wherein:
wherein the pin (84) extends through a cutout (700) in the load-connecting element (7).

8. The power electronics arrangement, according to claim 4, wherein:
the pin (84) extends into the interior of the load connection element (34); and
the load connection element (34) is partially a contact sleeve.

9. The power electronics arrangement, according to claim 1, wherein:
the load connection element (34) projects outwardly therefrom and through a plastic housing (30) of the power semiconductor module (3).

10. The power electronics arrangement, according to one of claim 1, wherein:
the load connection element (34) projects outwardly through a metallic baseplate (50);
the baseplate (50) being a part of a cooling device (52, 54) of the power semiconductor module (3); and
the load connection element (34) is electrically insulated with respect to the baseplate.

11. The power electronics arrangement, according to claim 1: wherein:
the mounting device (8) and the power semiconductor module (3) are fixably joined by threaded connection.

12. An electrically driven vehicle (9) with a power electronics arrangement (1) according to claim 1, further comprising:
an energy storage device (92) and with an electric drive motor (90) as a main drive or auxiliary drive.

13. The electrically driven vehicle according to claim 12, wherein:
the mounting device (8) is an integral component of a drive axle.

14. The electrically driven vehicle according to claim 12, wherein:
the energy storage device (92) and the drive motor (90) are electrically connected to the power semiconductor module (3) of the power electronics arrangement (1) by a plurality of the respective load connecting elements (7) and the assigned load connection elements.

15. The electrically driven vehicle according to claim 14, wherein:
the vehicle (9) is an industrial truck.

\* \* \* \* \*